United States Patent
Lee et al.

(10) Patent No.: US 10,753,567 B2
(45) Date of Patent: Aug. 25, 2020

(54) CAR LAMP USING SEMICONDUCTOR LIGHT EMITTING DEVICE

(71) Applicant: LG ELECTRONICS INC., Seoul (KR)

(72) Inventors: Sungwhan Lee, Seoul (KR); Hooyoung Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 44 days.

(21) Appl. No.: 16/151,442

(22) Filed: Oct. 4, 2018

(65) Prior Publication Data

US 2019/0203904 A1 Jul. 4, 2019

(30) Foreign Application Priority Data

Jan. 2, 2018 (KR) .................. 10-2018-0000327

(51) Int. Cl.
*F21S 43/16* (2018.01)
*F21S 43/31* (2018.01)
*F21S 43/15* (2018.01)
*F21S 43/19* (2018.01)
*F21S 43/20* (2018.01)
(Continued)

(52) U.S. Cl.
CPC ............. *F21S 43/16* (2018.01); *F21S 43/14* (2018.01); *F21S 43/15* (2018.01); *F21S 43/195* (2018.01); *F21S 43/255* (2018.01); *F21S 43/26* (2018.01); *F21S 43/30* (2018.01); *F21S 43/31* (2018.01); *H01L 25/0753* (2013.01); *H01L 33/44* (2013.01); *H01L 33/505* (2013.01); *H01L 33/507* (2013.01); *H01L 33/508* (2013.01); *H01L 33/54* (2013.01); *H01L 33/58* (2013.01); *H01L 33/60* (2013.01); *H01L 33/62* (2013.01); *F21W 2103/35* (2018.01); *F21W 2107/10* (2018.01); *H01L 33/30* (2013.01)

(58) Field of Classification Search
CPC .......... F21S 43/195; F21S 43/15; F21S 43/16; F21S 43/30; F21S 43/14; F21W 2103/35; F21W 2107/10; H01L 33/50–33/508; H01L 33/60; H01L 25/0753; F21K 9/68; F21K 9/69
See application file for complete search history.

(56) References Cited

U.S. PATENT DOCUMENTS

2016/0315068 A1* 10/2016 Lee .................. H01L 33/46
2016/0351620 A1* 12/2016 Tanaka ............. H01L 33/50

* cited by examiner

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

A light source unit for a car lamp. The light source unit includes a substrate including wiring electrodes; a plurality of semiconductor light emitting devices electrically connected to the wiring electrodes; a plurality of phosphor portions spaced apart at preset intervals and arranged along rows and columns, and respectively disposed between the semiconductor light emitting devices so as to convert light emitted by surrounding semiconductor light emitting devices into second light having a second wavelength and to emit the second light; a light transmitting material filled between the phosphor portions and emitting first light having a first wavelength; and a color filter covering the phosphor portions and the light transmitting material and emitting the first light with the first wavelength and the second light with the second wavelength.

15 Claims, 6 Drawing Sheets

(51) Int. Cl.
*F21S 43/14* (2018.01)
*F21S 43/30* (2018.01)
*H01L 33/44* (2010.01)
*H01L 33/50* (2010.01)
*H01L 33/54* (2010.01)
*H01L 33/60* (2010.01)
*H01L 33/58* (2010.01)
*H01L 33/62* (2010.01)
*H01L 33/30* (2010.01)
*H01L 25/075* (2006.01)
*F21W 107/10* (2018.01)
*F21W 103/35* (2018.01)

CAR LAMP USING SEMICONDUCTOR LIGHT EMITTING DEVICE

CROSS-REFERENCE TO RELATED APPLICATION

Pursuant to 35 U.S.C. § 119(a), this application claims the benefit of an earlier filing date and priority to Korean Patent Application No. 10-2018-0000327 filed in the Republic of Korea on Jan. 2, 2018, which is herein expressly incorporated by reference in its entirety.

BACKGROUND OF THE INVENTION

1. Field of the Invention

The present disclosure relates to a car lamp, and more particularly, to a car lamp using semiconductor light emitting devices.

2. Discussion of the Related Art

A vehicle is provided with a variety of car lamps having a lighting function or a signal function. Generally, halogen lamps or gas discharge lamps have been widely used, but in recent years, light emitting diodes (LEDs) have attracted attention as a light source of car lamps.

LEDs are minimized in size, which not only increases the design freedom of lamps, but also has economic efficiency due to semi-permanent lifetime, but are currently being produced in mostly package form. LEDs themselves, not packages, are semiconductor light emitting devices that convert current into light and are being developed as light sources for display images of electronic devices including information communication devices.

Since car lamps that have been developed so far use package type light emitting diodes, they are not good in terms of mass production yield, they are expensive, and there is a weak point that the degree of flexibility is low. Therefore, in recent years, there has been an attempt to manufacture a car lamp with a point light source using the semiconductor light emitting device itself rather than the package itself. However, when there exists a defective semiconductor light emitting device, there is a problem that a non-lighting region is exposed from the outside.

SUMMARY OF THE INVENTION

An object of the present disclosure is to implement a car lamp in which the semiconductor light emitting device can be a point light source having a large area.

Another object of the present disclosure is to implement a car lamp without a non-lighting region even in the presence of a defective semiconductor light emitting device.

In order to accomplish the objects of the present disclosure, a car lamp according to the present disclosure may provide dot-shaped phosphors disposed between semiconductor light emitting devices, thereby implementing a point light source having a large area without a non-lighting region.

Specifically, a car lamp according to the present disclosure may include a light source unit for emitting light, and the light source unit may include a substrate on which wiring electrodes are formed, a plurality of semiconductor light emitting devices electrically connected to the wiring electrodes, and a plurality of phosphor portions disposed on the plurality of semiconductor light emitting devices, and formed to convert the wavelength of light, wherein the plurality of phosphor portions are spaced apart at preset intervals and arranged along rows and columns thereof, and respectively disposed between the plurality of semiconductor light emitting devices so as to emit light by the surrounding semiconductor light emitting devices.

According to an embodiment, the plurality of phosphor portions may be respectively disposed in a region surrounded by the surrounding semiconductor light emitting devices. The center of the phosphor portions may be disposed in the middle of a region surrounded by the surrounding semiconductor light emitting devices. The plurality of phosphor portions and the plurality of semiconductor light emitting devices may be disposed so as not to overlap with each other along the thickness direction of the substrate.

According to an embodiment, the wiring electrode may be provided with a common electrode surface on which the plurality of semiconductor light emitting devices overlap with each other, and the common electrode surface may form a lower wiring. An insulating material may be filled between the plurality of semiconductor light emitting devices to form an insulating layer, and an upper wiring connected to the plurality of semiconductor light emitting devices may be disposed on the insulating layer. The lower wiring may be electrically connected to either one of a p-type electrode and an n-type electrode of the semiconductor light emitting devices, and the upper wiring may be connected to the other of the p-type electrode and the n-type electrode, and formed in a line shape.

According to an embodiment, a light transmitting material may be filled between the phosphor portions, and a color filter may be disposed to cover the phosphor portions and the light transmitting material. According to an embodiment, the car lamp may include a reflector formed to reflect light between the phosphor portions.

The reflector may be formed of a flat plate to cover the plurality of semiconductor light emitting devices, and the flat plate may be formed with a through hole corresponding to the phosphor portion. A protruding portion may be formed at a lower portion of the reflector to spread light emitted from the plurality of semiconductor light emitting devices. The protruding portion may have a reflective surface for reflecting light to the adjacent phosphor portion. An area of the reflector may be formed to be larger than that of the phosphor portions.

According to an embodiment, an optical gap layer may be formed between the plurality of semiconductor light emitting devices and the phosphor portion. A lens formed in a convex shape toward the substrate may be disposed below the phosphor portion.

In a car lamp according to the present disclosure, light may be emitted in in a dot form between the semiconductor light emitting devices, thereby implementing light emission of a point light source without non-lighting even when there exists a defective semiconductor light emitting device. Furthermore, through the emission of the point light source, the present disclosure provides a novel type car lamp.

In addition, a phosphor may be located in a space interpolated with the surrounding semiconductor light emitting device, thereby implementing a point light source having almost no difference from the brightness of the surrounding portion even when there exists a defective semiconductor light emitting device. Therefore, it is possible to reduce a light emitting deviation that may occur at each position in the car lamp.

Besides, such a structure may not require repair for a defective semiconductor light emitting device to facilitate the manufacturing process, thereby having advantages in price and process complexity.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1A:
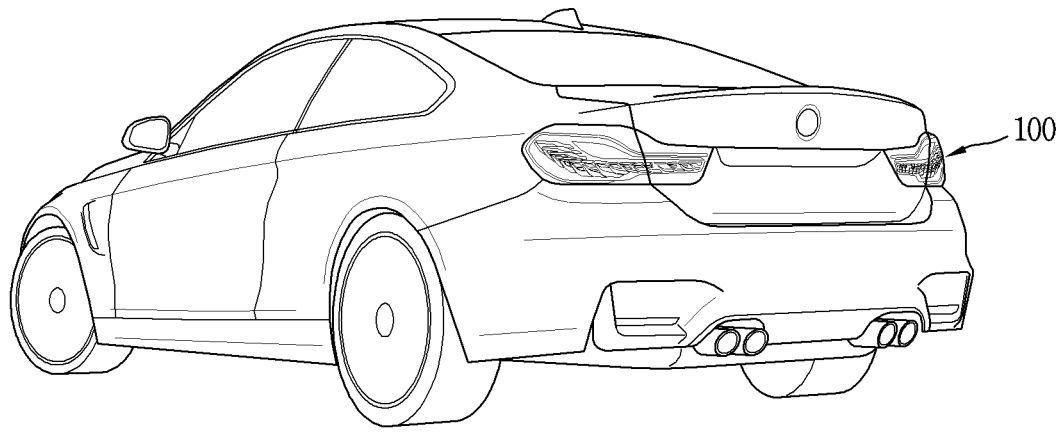
FIG. 1A is a conceptual view illustrating a rear lamp as an embodiment of a car lamp.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Furthermore, when an element such as a layer, region or substrate is referred to as being "on" another element, it can be directly on the another element or an intermediate element may also be interposed therebetween.

The car lamp described in this specification may include a headlight (head lamp), a taillight, a sidelight, a fog light, a turn signal light, a brake light (brake lamp), an emergency light, a reversing light (tail lamp), and the like. However, it would be easily understood by those skilled in the art that a configuration disclosed herein may be applicable to any device capable of emitting light even though it is a new product type which will be developed later.

Figure 1B:
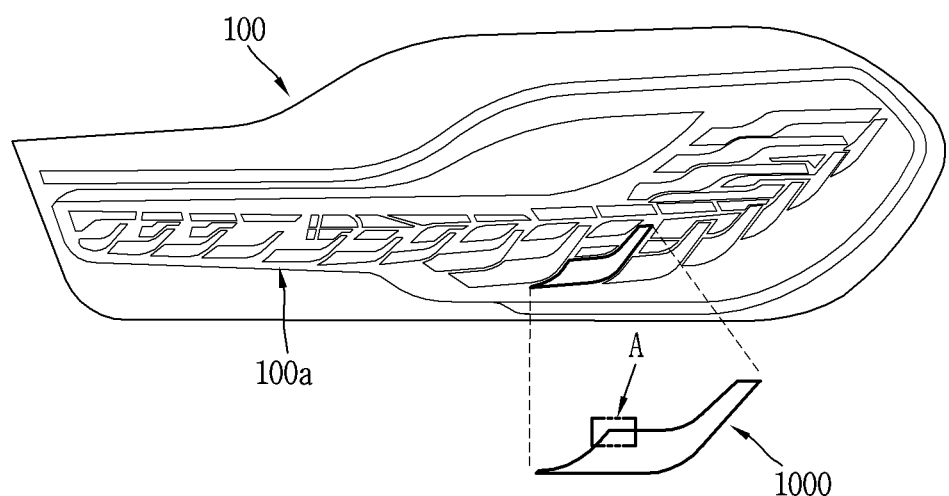
FIG. 1B is an enlarged view illustrating a state in which the rear lamp of FIG. 1A is emitted.

FIG. 1A is a conceptual view illustrating a rear lamp as an embodiment of a car lamp, and FIG. 1B is an enlarged view illustrating a state in which the rear lamp of FIG. 1A is emitted. Referring to FIG. 1A, the rear lamps 100 of a vehicle are disposed on both sides of a rear surface of the vehicle, thereby forming a rear appearance of the vehicle.

The rear lamp 100 may be a lamp in which a taillight, a turn signal light, a brake lamp, an emergency light, a tail lamp, and the like are combined in a package form. In other words, the rear lamp 100 includes a plurality of lamps selectively emitting light according to the control of the vehicle.

In this instance, at least one of the plurality of lamps may be formed to emit a preset shape. For example, the brake lamp 100a may be formed in an elongated manner in the horizontal direction, and curved in at least a part in the vertical direction so as to emit a shape of the brake lamp 100a. Further, the brake lamp may be bent toward the front of the vehicle. Also, the complex shape of such a three-dimensional shape may be implemented by a plurality of light emitting regions.

Referring to FIG. 1B, the light emitting regions having different shapes are combined with each other to implement the predetermined shape. In addition, a light source unit 1000 implemented by a semiconductor light emitting device is disposed in the light emitting region. The light source unit 1000 can be fixed to a vehicle body through a, and a wiring line for supplying power to the light source unit 1000 can be connected to the.

The light source unit may be a flexible light source unit that is flexible, bendable, twistable, foldable or rollable by an external force. The light source unit may also be a planar light source having a light emitting surface corresponding to the light emitting region. In this instance, the light source unit 1000 may include a plurality of light emitting units and be disposed in each of the light emitting regions, or one light source unit may be formed to implement the entire shape.

In addition a pixel of the light source 1000 may be implemented by a semiconductor light emitting device. According to the present disclosure, a light emitting diode (LED) is illustrated as a type of semiconductor light emitting device. Further, the light emitting diode may be a light emitting device having a size ranging from several to several tens of micrometers, thereby allowing the light emitting device to function as a pixel in the three-dimensional space.

Hereinafter, the light source unit implemented using the light emitting diode will be described in more detail. In particular, FIG. 2 is a partially enlarged view of a portion A in FIG. 1B, FIGS. 3A and 3B are a plan view and a cross-sectional view illustrating a light source unit in FIG. 2, and FIG. 4 is a conceptual view illustrating a vertical type semiconductor light emitting device in FIG. 3.

Figure 2:
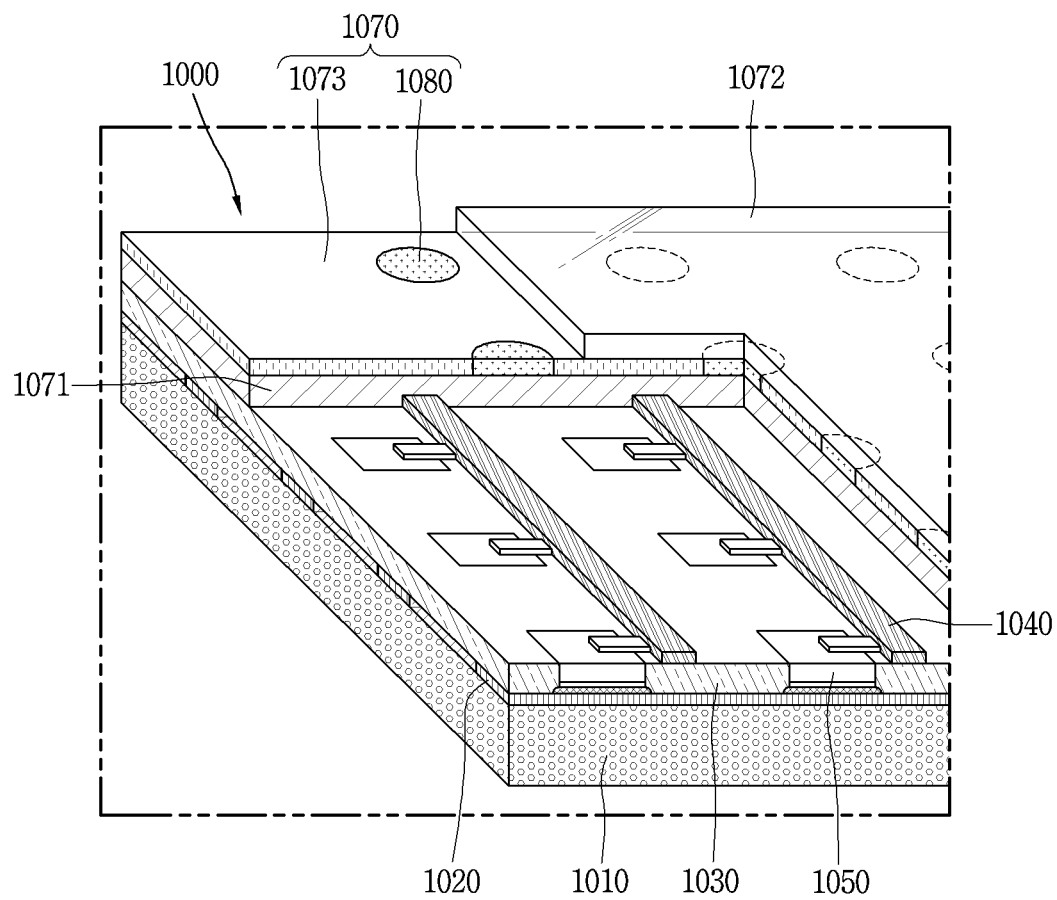
FIG. 2 is a partially enlarged view of a portion A in FIG. 1B.
Figure 3A:
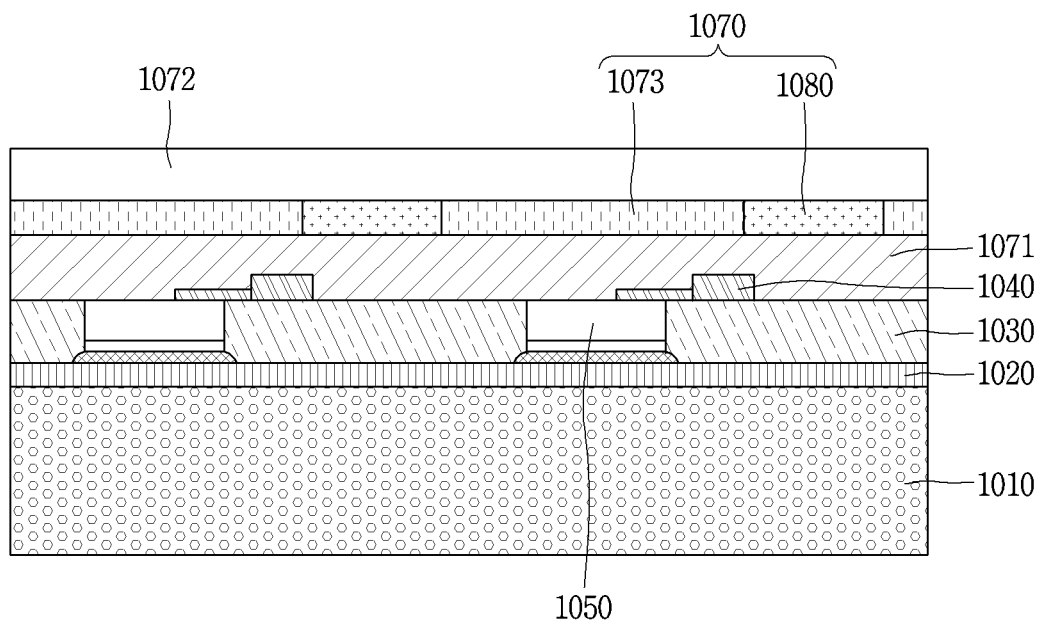
FIGS. 3A and 3B are a plan view and a cross-sectional view illustrating a light source unit in FIG. 2.
Figure 3B:
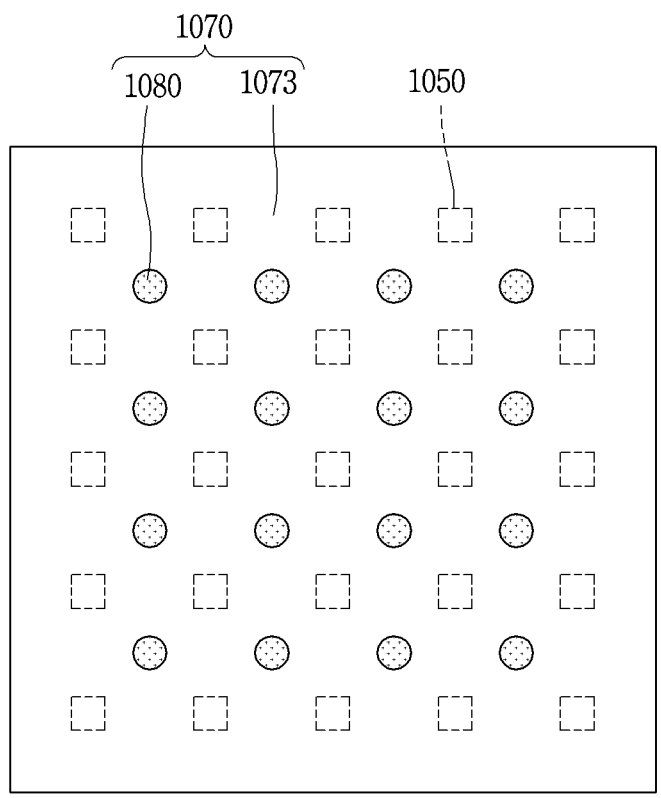
Figure 4:
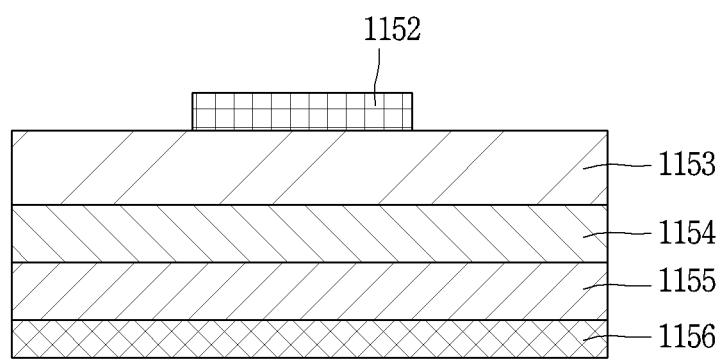
FIG. 4 is a conceptual view illustrating a vertical type semiconductor light emitting device in FIG. 3.

FIGS. 2-4 illustrate a passive matrix (PM) type semiconductor light emitting device being used as a light source unit 1000 using a semiconductor light emitting device. However, an example described below may also be applicable to an active matrix (AM) type semiconductor light emitting device.

As shown, the light source unit 1000 includes a base substrate 1010, a first electrode 1020, an insulating layer 1030, a second electrode 1040, and a plurality of semiconductor light emitting devices 1050. The base substrate 1010 may be a base layer on which a structure is formed through an entire process, and may be a wiring substrate on which the first electrode 1020 is disposed. The base substrate 1010 may include glass or polyimide (PI) to implement a flexible light source unit. Furthermore, the base substrate 1010 may be a thin metal. In addition, if it is an insulating and flexible material, any one such as polyethylene naphthalate (PEN), polyethylene terephthalate (PET) or the like may be used. Furthermore, the substrate 110 may be either one of transparent and non-transparent materials.

Further, a heat dissipation sheet, a heat sink, or the like can be mounted on the base substrate 1010 to implement a heat dissipation function. In this instance, the heat dissipation sheet, the heat sink, or the like can be mounted on an opposite side of the surface on which the first electrode 1020 is disposed.

In addition, the first electrode 1020 can be disposed on the base substrate 1010 and formed as a line-shaped electrode. Accordingly, the first electrode 1020 can be an electrode layer disposed on the base substrate, and include a plurality of lines serving as data electrodes. As described above, the first electrode 1020 serves as a wiring of the semiconductor light emitting device, and therefore, the first electrode 1020 can be referred to as a wiring electrode. Furthermore, since the first electrode 1020 is disposed under the semiconductor light emitting device, the first electrode 1020 can be a lower wiring.

In addition, the second electrode 1020 may be coupled to the semiconductor light emitting device 1050 by soldering or the like. In this instance, the insulating layer 1030 is formed on the base substrate 1010 on which the first electrode 1020 is located.

Further, an insulating material is filled in a space between the semiconductor light emitting devices to form the insulating layer 1030, and has an insulating property. In addition, the insulating layer 1030 may have flexibility, thereby allowing the light source unit to be flexible.

Further, the insulating layer 1030 may be a transparent insulating layer including silicon oxide (SiOx) or the like. In another example, the insulating layer 1030 may be formed of a polymer material such as epoxy, methyl, or phenyl-based silicone having excellent insulation characteristics and low light absorption, or an inorganic material such as SiN or Al2O3, as a structure for preventing short between electrodes. In still another example, the insulating layer 1030 may be replaced by a layer having adhesiveness and conductivity. More specifically, the insulating layer 1030 can be replaced by an anisotropic conductive film (ACF), an anisotropic conductive paste, a solution containing conductive particles, and the like.

In more detail, the anisotropic conductive film includes an anisotropic conductive medium mixed with an insulating base member, and thus when heat and pressure are applied thereto, only a specific portion thereof can have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. In one example, the anisotropic conductive film includes an anisotropic conductive medium mixed with an insulating base member, and thus when heat and pressure are applied thereto, only a specific portion thereof has conductivity by the conductive balls. The anisotropic conductive film may also include a core with a conductive material containing a plurality of particles coated by an insulating layer with a polymer material, and in this instance, can have conductivity by the core while breaking an insulating layer on a portion to which heat and pressure are applied.

The core can be transformed to implement a layer having both surfaces to which objects contact in the thickness direction of the film. In a more specific example, heat and pressure are applied to an anisotropic conductive film as a whole, and electrical connection in the z-axis direction is partially formed by a height difference from a mating object adhered by the use of the anisotropic conductive film.

In another example, an anisotropic conductive film may contain a plurality of particles in which a conductive material is coated on insulating cores. In this instance, a portion to which heat and pressure are applied can be converted (pressed and adhered) to a conductive material to have conductivity in the thickness direction of the film. In still another example, the film can be formed to have conductivity in the thickness direction of the film in which a conductive material passes through an insulating base member in the z-direction. In this instance, the conductive material may have a pointed end portion.

Further, the anisotropic conductive film may be a fixed array anisotropic conductive film (ACF) including conductive balls inserted into one surface of the insulating base member. More specifically, the insulating base member includes an adhesive material, and the conductive balls are intensively disposed at a bottom portion of the insulating base member. When heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or include a plurality of layers in which conductive balls are disposed at any one layer (double-ACF), and the like.

Further, the anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

When an anisotropic conductive film is located, for example, when the first electrode 1020 is located on the base substrate 1010, and then heat and pressure are applied to connect the semiconductor light emitting device 1050 thereto, the semiconductor light emitting device 1050 is electrically connected to the first electrode 1020. At this time, the semiconductor light emitting device 1050 may be preferably disposed on the first electrode 1020. Furthermore, the anisotropic conductive film contains an adhesive component, and thus the adhesive layer 1030 implements a mechanical coupling as well as an electrical coupling between the semiconductor light emitting device 1050 and the first electrode 1020. In yet still another example, the adhesive layer may include a tin-based alloy for Eutectic bonding, Au, Al, or Pb, and the substrate and the semiconductor light emitting device may be bonded by Eutectic bonding.

The semiconductor light emitting device 1050 has excellent luminance characteristics, and thus it is possible to configure individual sub-pixels even with a small size thereof. For example, the size of the individual semiconductor light emitting device 1050 may be less than 80 μm in the length of one side thereof, and formed with a rectangular or square shaped element. In this instance, the area of a single semiconductor light emitting device may have a range of 10-10~10-5 m2, and a distance between the light emitting devices may have a range of 100 μm to 10 mm.

Further, the semiconductor light emitting device 1050 may be a vertical structure. However, the present disclosure is not limited thereto, and the semiconductor light emitting device may be a flip chip type light emitting device. Also, a plurality of second electrodes 1040 are positioned between the vertical semiconductor light emitting devices, and the plurality of second electrodes 1040 are electrically connected to the semiconductor light emitting device 1050.

Referring to FIG. 4, the vertical semiconductor light emitting device may include a p-type electrode 1156, a p-type semiconductor layer 1155 formed with the p-type electrode 1156, an active layer 1154 formed on the p-type semiconductor layer 1155, an n-type semiconductor layer 1153 formed on the active layer 1154, and an n-type electrode 1152 formed on the n-type semiconductor layer 1153. In this instance, the p-type electrode 1156 located at the bottom thereof may be electrically connected to the first electrode 1020 by the adhesive layer 1030, and the n-type electrode 1152 located at the top thereof can be electrically connected to the second electrode 1040 which will be described later. The electrodes are disposed in the upward/downward direction in the vertical semiconductor light emitting device 1050, thereby providing a great advantage capable of reducing the chip size.

In addition, the n-type electrode 1152 and the p-type electrode 1156 can be formed by a deposition process such as sputtering, but the present disclosure is not limited thereto. Here, the n-type electrode 1152 may be a second conductive electrode, and the p-type electrode 1156 may be a first conductive electrode. Furthermore, the p-type semiconductor layer may be a first conductive semiconductor layer, and the n-type semiconductor layer may be a second conductive semiconductor layer.

In addition, according to another embodiment of the present disclosure, impurities may be implanted into an intrinsic or a doped semiconductor substrate to form the first and the second conductive semiconductor layer. Further, the region where a p-n junction is formed by the impurity implantation may serve as the active layer. Therefore, the following description of the p-type semiconductor layer, the n-type semiconductor layer, and the active layer is merely exemplary and the present disclosure is not limited thereto.

Referring again to FIGS. 2, 3A and 3B, an upper wiring connected to the plurality of semiconductor light emitting devices is disposed on the insulating layer 1030. For example, the second electrode 1040 can be electrically connected to the semiconductor light emitting devices 1050, and disposed on one side of the insulating layer 1030.

In this instance, the lower wiring can be electrically connected to either one of the p-type electrode 1156 and the n-type electrode 1152 of the semiconductor light emitting devices, and the upper wiring can be electrically connected to the other one of the p-type electrode 1156 and the n-type electrode 1152. More specifically, the n-type electrode 1152 can be electrically connected to the second electrode 140. However, the present disclosure is not limited thereto, and when the insulating layer 1030 is replaced with an anisotropic conductive film or the like, the second electrode 1040 can be located on the anisotropic conductive film.

In addition, the second electrode 1040 may be a plurality of lines located between the semiconductor light emitting devices 1050 and electrically connected to the semiconductor light emitting devices 1050. For example, the semiconductor light emitting devices 1050 can be disposed in a plurality of rows, and the second electrode 1040 can be formed as a long bar type electrode in one direction, and located between the rows of the semiconductor light emitting devices 1050. In this instance, since a distance between the semiconductor light emitting devices 1050 constituting individual pixels is sufficiently large, the second electrode 1040 can be located between the semiconductor light emitting devices 1050.

In addition, the second electrode 1040 may be electrically connected to the semiconductor light emitting device 1050 by a connecting electrode protruded from the second electrode 1040. In more detail, the connecting electrode may be an n-type electrode 1152 of the semiconductor light emitting device 1050. For example, the n-type conductive electrode 1152 is formed with an ohmic electrode for ohmic contact, and the second electrode 1040 covers at least part of the ohmic electrode by printing or deposition. Through this, the second electrode 1040 can be electrically connected to the n-type electrode 1152 of the semiconductor light emitting device 1050.

In addition, the light source unit includes a plurality of phosphor portions 1080 disposed above the plurality of semiconductor light emitting devices, and converting the wavelength of light. For example, the semiconductor light emitting device 1050 is a blue semiconductor light emitting device 1151 that emits blue (B) light, and the phosphor portions 1080 for converting the blue (B) light into another color can be provided thereon.

In this instance, the phosphor portions 1080 may include any one of a red phosphor capable of converting blue light into red (R) light, a green phosphor capable of converting blue light into green (G) light, and a yellow phosphor capable of converting blue light into while (W) light. In another example, the red phosphors and green phosphors may be provided to mix light of various wavelengths so as to implement white light.

In the present embodiment, the rear lamp 100 that emits red light is illustrated, and thus the phosphor portions 1080 include a red phosphor. However, the present disclosure is not limited thereto, and when a GaAs-based red semiconductor light emitting device is used, a light diffusion film other than a phosphor may be used for the phosphor portion. Further, a patterned sheet may be inserted in a upper portion or a lower portion of the phosphor portion to improve a light extraction efficiency.

In this instance, an optical gap layer 1071 can exist between the semiconductor light emitting element 1050 and the phosphor portion 1080. In more detail, the optical gap layer 1071 may be a layer filled with a material for forming a gap between the semiconductor light emitting device 1050 and the phosphor layer 1080 and enhancing light extraction efficiency. For example, the optical gap layer 1071 may be formed of a material such as epoxy, acrylic, or methyl or phenyl-based silicone having a low light absorption and excellent bending property. Furthermore, a patterned sheet may be inserted for optimization of light efficiency, or particles having different refractive indexes may be mixed.

As an optical gap layer is formed between the semiconductor light emitting device 1050 and the phosphor portion 1080, leakage of light due to a difference in refractive index can be mitigated or prevented. Since the refractive index of the air is about 1 and the refractive index of the phosphor is set to a larger value (for example, 1.3 to 1.5), the amount of light incident on the phosphor portion 1080 can be reduced when there exists a vacant space.

Also, a color filter 1072 can be layered on the phosphor portions 1080 to improve the color purity of the converted light. In this instance, the color filter 1072 can only the red wavelength and filters the rest. In addition, the color filter 1072 may be formed to cover a protection layer to protect the light source portion from moisture, oxygen, and external impact. The protective layer can also be formed through film bonding or resin coating.

Further, the plurality of phosphor portions 1080 are spaced apart at preset intervals and arranged along rows and columns thereof, and are respectively disposed between the plurality of semiconductor light emitting devices 1050 so as to emit light by the surrounding semiconductor light emitting devices. In other words, the plurality of phosphor portions 1080 and the plurality of semiconductor light emitting devices 1050 are disposed so as not to overlap with each other along the thickness direction of the substrate.

For example, the plurality of phosphor portions 1080 are disposed between the semiconductor light emitting devices in a dot form, thereby implementing a point light source having a large area without a non-lighting region. More specifically, a light transmitting material 1073 is filled between the plurality of phosphor portions 1080, and a wavelength conversion sheet 1070 can be formed together with the plurality of phosphor portions 1080.

In addition, a region where the light transmitting material 1073 is filled in the wavelength conversion sheet 1070 may be a region surrounded by the surrounding semiconductor light emitting devices. In this instance, each of the plurality of phosphor portions 1080 can be respectively disposed in a region surrounded by the surrounding semiconductor light emitting devices 1050. According to this structure, light passing through the region where the light transmitting material 1073 is filled in the wavelength conversion sheet 1070 and light passing through the phosphor portions 1080 have different wavelengths.

Also, the color filter 1072 is disposed to cover the phosphor portions 1080 and the light transmitting material 1073, thereby producing first red and second red while light having a different wavelength passes through the color filter 1072. The first red is a light emitted in a region where the light transmitting material is filled, and outputs light as a surface light source, and is responsible for the overall light emission of the rear lamp. Alternatively, the second red is light emitted from the phosphor portions 1080, and outputs light as a point light source, and emits light in a dot form. A combination of the surface light source and the point light source implement a novel type of rear lamp in which the second red exists in a dot form in the region for outputting the first red.

In addition, the center of the phosphor portions 1080 can be disposed at the center of a region surrounded by the semiconductor light emitting devices 1050. More specifically, the phosphor portions 1080 are positioned such that a distance between the center of the phosphor dot and the peripheral semiconductor light emitting device is the same. Through this, a brightness deviation between the phosphor dots can be reduced.

According to the foregoing structure, a phosphor can be located in a space interpolated with the surrounding semiconductor light emitting device, thereby implementing a point light source having almost no difference from the brightness of the surrounding portion even when there exists a defective semiconductor light emitting device.

Further, even when a defective semiconductor light emitting device is present, a point light source having substantially no difference from the brightness of the peripheral portion can be implemented in a modified structure in various forms. Hereinafter, these modifications will be described.

Figure 5:
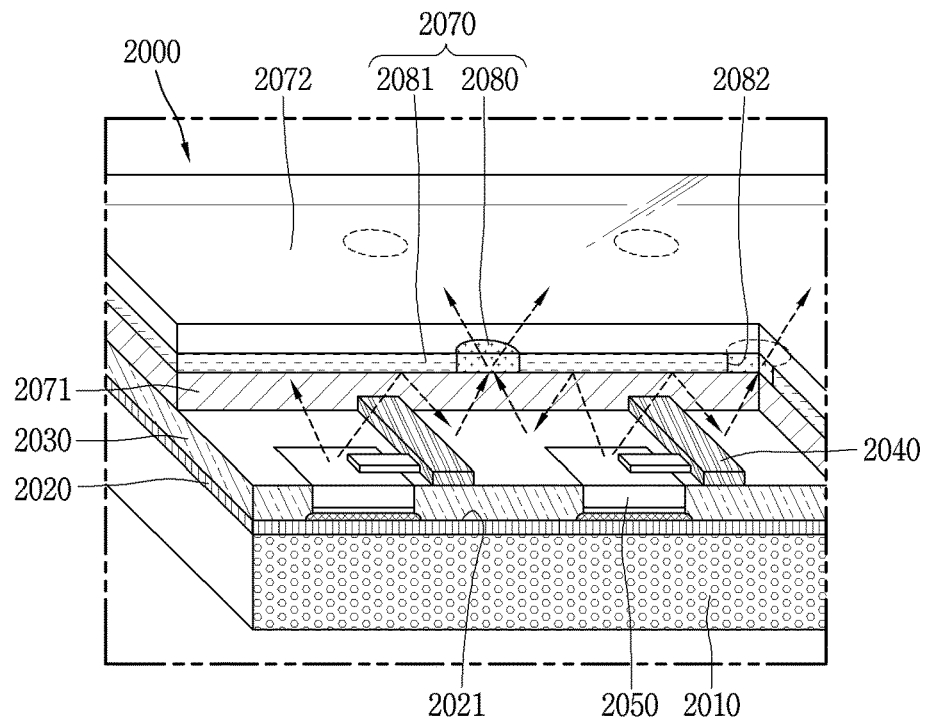
FIGS. 5 through 7 are cross-sectional views illustrating a rear lamp according to other embodiments of the present disclosure.
Figure 6:
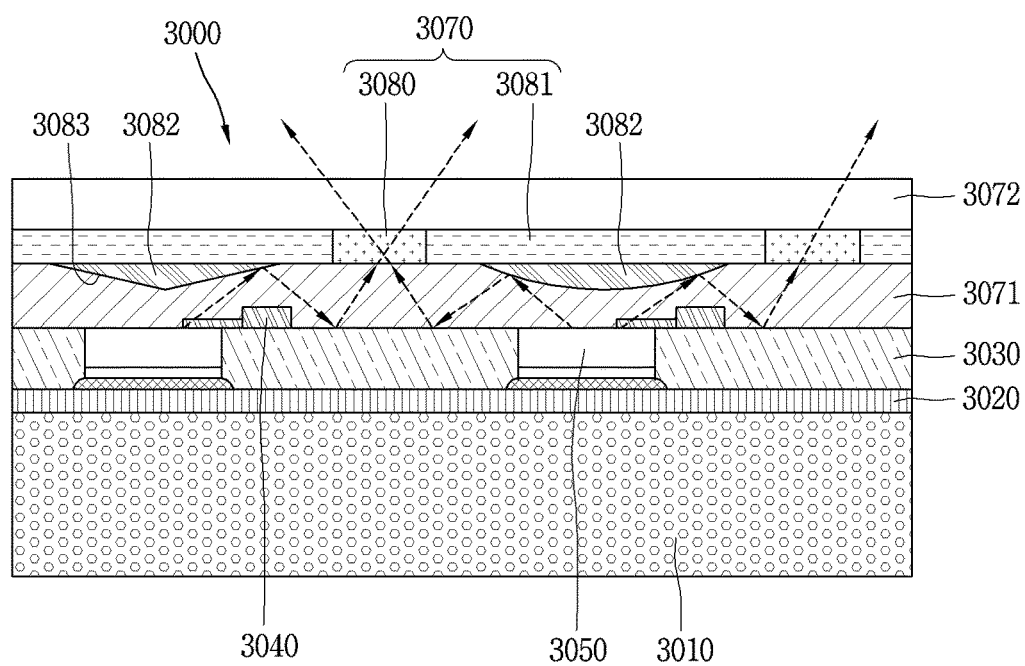
Figure 7:
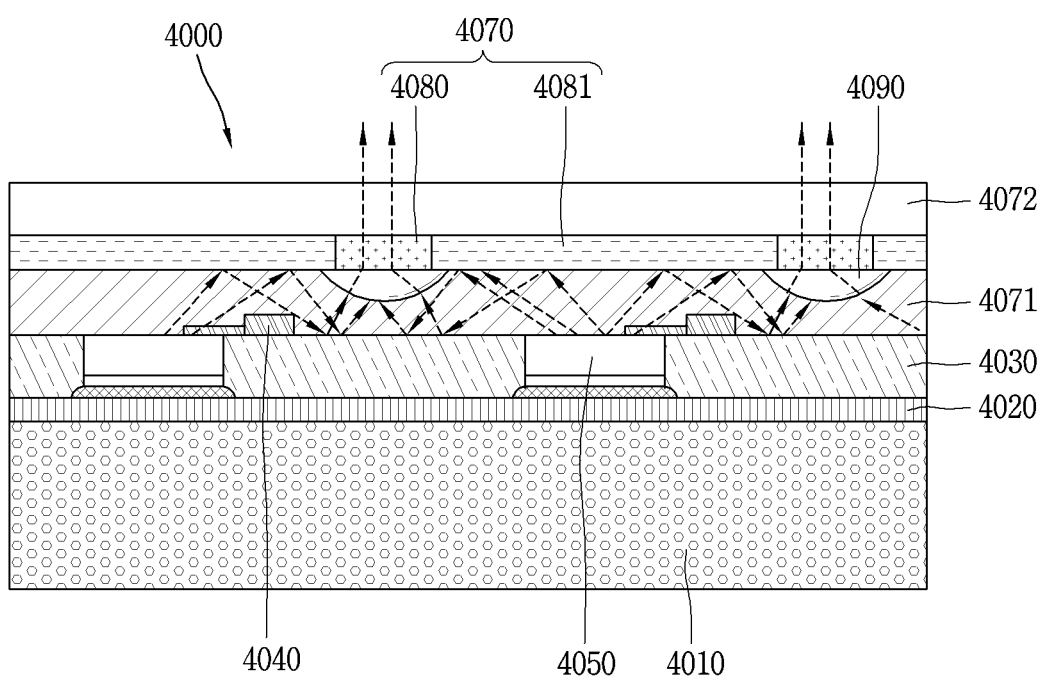

In particular, FIGS. 5 through 7 are cross-sectional views illustrating a rear lamp according to other embodiments of the present disclosure. According to the illustration of FIG. 5, the rear lamp may include a plurality of phosphor portions arranged in a dot form and located between the semiconductor light emitting devices. In this instance, similarly to the foregoing example, the light source unit of the rear lamp may include a base substrate 2010, a first electrode 2020, an insulating layer 2030, a wavelength conversion sheet 2070, a second electrode 2040, and a plurality of semiconductor light emitting devices 2050.

In this instance, the structure other than the first electrode and the wavelength conversion sheet may have the same structure as the foregoing example, and therefore, the description thereof will be substituted by the early description. For example, the first electrode 2020 is located on the base substrate 2010 and provided with a common electrode surface 2021 on which the plurality of semiconductor light emitting devices overlap with each other. The first electrode 2020 may be a planar electrode layer disposed on the base substrate, and configured to serve as a data electrode.

The common electrode surface 2021 serves as a common electrode of the semiconductor light emitting device, and may be referred to as a wiring electrode. Furthermore, since the first electrode 2020 is disposed under the semiconductor light emitting device 2050, the common electrode surface 1020 may be a lower wiring.

The common electrode surface 2021 covers a space between the plurality of semiconductor light emitting devices 2050 to reflect light between the plurality of semiconductor light emitting devices 2050, thereby implementing the structure of a high reflection electrode layer and enhancing light efficiency. The common electrode surface 2021 may overlap with 10 to 100,000 semiconductor light emitting devices, and the semiconductor light emitting device 2050 can cover the common electrode surface 2021 in an array form.

For example, the plurality of semiconductor light emitting devices 2050 can be formed in a matrix form, and the common electrode surface 2021 can have a structure of overlap with the semiconductor light emitting device 2050 along vertical and horizontal directions. More specifically, the plurality of semiconductor light emitting devices 2050 are arranged along rows and columns, and the common electrode surface 2021 is formed such that the plurality of semiconductor light emitting devices 2050 arranged along rows and columns are overlapped with each other.

In another example, the electrode layer includes a plurality of unit electrode layers, and the unit electrode layers may include unit common electrode surfaces each having a size corresponding to a plurality of semiconductor light emitting devices. The unit common electrode planes are electrically connected to each other to easily implement a planar light source having a large area. In this instance, it is possible to cope with various manufacturing sizes and shapes in terms of structure, and the unit surface light source can be replaced, thereby enhancing the product life and facilitating the repair. The first electrode 2020 and the semiconductor light emitting device 2050 may be bonded by soldering or the like or bonded by an anisotropic conductive film as described above.

On the contrary, the second electrode 2040, which is an upper wiring, is located between the semiconductor light emitting devices 2050, and electrically connected to the semiconductor light emitting devices 2050. For example, the semiconductor light emitting devices 2050 may be disposed in a plurality of rows, and the second electrode 2040 may be located between the rows of the semiconductor light emitting devices 2050. A more detailed description of the second electrode 2040 will be substituted by the earlier description with reference to FIGS. 2 through 4.

Also, the light source unit includes a plurality of phosphor portions 2080 disposed on the plurality of semiconductor light emitting devices 2050, and convert the wavelength of light. For example, if the semiconductor light emitting device 2050 is a blue semiconductor light emitting device that emits blue (B) light, the phosphor portions 2080 for converting the blue (B) light into another color can be provided thereon.

In this instance, the phosphor portions 2080 may include any one of a red phosphor capable of converting blue light into red (R) light, a green phosphor capable of converting blue light into green (G) light, and a yellow phosphor capable of converting blue light into while (W) light. In another example, the red phosphors and green phosphors may be provided to mix light of various wavelengths so as to implement white light.

As in the above-described example, the phosphor portions 2080 include a red phosphor. However, the present disclosure is not limited thereto, and when a GaAs-based red semiconductor light emitting device is used, a light diffusion film other than a phosphor may be used for the phosphor portion. Further, a patterned sheet may be inserted in a upper portion or a lower portion of the phosphor portion to improve light extraction efficiency.

In this instance, an optical gap layer 2071 may exist between the semiconductor light emitting device 2050 and the phosphor portion 2080. The detailed description of the optical gap layer 2071 will be substituted by the earlier description with reference to FIGS. 2 through 4. Further, the color filter 2072 is layered on the phosphor portions 2080 to improve the color purity of the converted light, and the description of the color filter 2072 is also replaced with the foregoing description with reference to FIGS. 2 through 4.

In addition, the light source unit 2000 may include a reflector 2081 formed to reflect light between the phosphors 2080. As shown, the plurality of phosphor portions 2080 are spaced apart at preset intervals and arranged along rows and columns thereof, and respectively disposed between the plurality of semiconductor light emitting devices 2050 so as to emit light by the surrounding semiconductor light emitting devices. In addition, the plurality of phosphor portions 2080 and the plurality of semiconductor light emitting devices 2050 are arranged so as not to overlap with each other along the thickness direction of the substrate, and the reflector 2081 overlaps with the plurality of semiconductor light emitting devices 2050.

For example, the plurality of phosphor portions 2080 are disposed between the semiconductor light emitting devices in a dot form, thereby implementing a point light source having a large area without a non-lighting region. More specifically, the reflector 2081 is formed between the plurality of phosphor portions 2080, and the wavelength conversion sheet 2070 may be formed together with the plurality of phosphor portions 2080.

The reflector 2081 may be formed as a flat plate to cover the plurality of semiconductor light emitting devices, and a through hole 2082 corresponding to the phosphor portion 2080 may be formed on the flat plate. The through hole 2082 is filled with a red phosphor.

According to this structure, the wavelength conversion sheet 2070 includes a reflection region where the reflection portion 2081 is disposed and a conversion region where the phosphor portions are disposed, and the conversion region may be disposed inside a region surrounded by the surrounding semiconductor light emitting devices. Therefore, light is reflected in the reflection region, and light passes through the phosphor portions 2080 in the conversion region on the wavelength conversion sheet 2070.

In this instance, an area of the reflector 2081 is formed to be larger than that of the phosphor portions. Also, phosphor dots become more visible, and the brightness of the phosphor dots further increases. In addition, a rear lamp having a novel structure that emits light in the form of a point light source can be implemented through this.

In addition, the center of the phosphor portions 2080 are disposed at the center of a region surrounded by the surrounding semiconductor light emitting devices. More specifically, the phosphor portions 2080 are positioned such that a distance between the center of the phosphor dot and the peripheral semiconductor light emitting device is the same. Thus, a brightness deviation between the phosphor dots may be reduced.

In the example described above with reference to FIG. 5, the wavelength conversion sheet 2070 and the first electrode 2020 are different from the example described with reference to FIGS. 2 to 4, but it is also possible that only either one of the wavelength conversion sheet 2070 and the first electrode 2020 is different.

As shown in FIG. 6, the light source unit of the rear lamp may include a base substrate 3010, a first electrode 3020, an insulating layer 3030, a wavelength conversion sheet 3070, a second electrode 3040, and a plurality of semiconductor light emitting devices 3050. In this instance, the structure other than the reflector 3081 of the wavelength conversion sheet 3070 may have the same structure as the foregoing example, and therefore, the description thereof will be substituted by the early description.

In addition, the light source unit 3000 may include a reflector 3081 formed to reflect light between the phosphors 3080 similarly to the foregoing example. Also, the plurality of phosphor portions 3080 are spaced apart at preset intervals and arranged along rows and columns thereof, and respectively disposed between the plurality of semiconductor light emitting devices 3050 so as to emit light by the surrounding semiconductor light emitting devices. Further, the plurality of phosphor portions 3080 and the plurality of semiconductor light emitting devices 3050 are arranged so as not to overlap with each other along the thickness direction of the substrate, and the reflector 3081 overlaps with the plurality of semiconductor light emitting devices.

For example, the plurality of phosphor portions 3080 are disposed between the semiconductor light emitting devices 3050 in a dot form, thereby implementing a point light source having a large area without a non-lighting region. More specifically, the reflector 3081 is formed between the plurality of phosphor portions 3080, and the wavelength conversion sheet 3070 is formed together with the plurality of phosphor portions 3080.

The wavelength conversion sheet 3070 includes a reflection region where the reflector 3081 is disposed and a conversion region where the phosphor portions 3080 are disposed. In addition, the conversion region can be disposed inside a region surrounded by the surrounding semiconductor light emitting devices 3050.

Referring to FIG. 6, a protruding portion 3082 is formed at a lower portion of the reflector 3081 to spread light emitted from the plurality of semiconductor light emitting devices. For example, the protruding portion 3082 protrudes from at least a part of the reflector 3081 toward the semiconductor light emitting device. The protruding portion 3082 has a reflective surface 3083 that reflects light to the adjacent phosphor portion 3080. In more detail, the reflective surface 3083 is formed to be inclined with respect to the thickness direction of the light source unit, and reflects light directed toward the reflector 2081 3081 toward the insulating layer 3030. Reflection occurs again at an interface of the insulating layer 3030 so that the light is directed to the phosphor portions 3080. Therefore, an amount of light incident on the phosphor portions 3080 is increased, and the brightness of the light source unit is increased.

Further, as shown in FIG. 7, the light source unit 4000 of the rear lamp may further include a lens 4090 in addition to the above-described examples. In other words, the light source unit 4000 of the rear lamp includes a base substrate 4010, a first electrode 4020, an insulating layer 4030, a wavelength conversion sheet 4070, a second electrode 4040, and a plurality of semiconductor light emitting devices 4050, and the structure thereof may have the same structure as any one of the foregoing examples, and thus the description thereof will be substituted by the earlier description.

However, in this example, the lens 4090 may be formed in a convex shape from a lower portion of the phosphor portion 4080 toward the substrate. In particular, the lens 4090 may have a lens shape formed below the wavelength conversion sheet 4070, and may be disposed on a lower surface of the phosphor portions 4080. Accordingly, the lens 4090 may be integrated with the wavelength conversion sheet 4070. In addition, the lens 4090 is matched with the phosphor portions 4080 at a one-to-one ratio.

The lens 4090 is formed with a convex lens, and light may be refracted as it enters to have a beam angle. By the design of the convex lens, light is refracted in a direction parallel to the thickness direction of the light source part 4000 to be incident on the phosphor portions 4080, thereby improving the light efficiency.

As described above, according to embodiments of the present disclosure, a phosphor material in a dot form is disposed between the semiconductor light emitting devices to implement the light emission of a point light source without non-lighting even when there exists a defective semiconductor light emitting device.

The configurations and methods according to the above-described embodiments will not be applicable in a limited way to the foregoing car lamp using a semiconductor light emitting device, and all or part of each embodiment may be selectively combined and configured to make various modifications thereto.

What is claimed is:

1. A light source unit for a car lamp, the light source unit comprising:
   a substrate including wiring electrodes;
   a plurality of semiconductor light emitting devices electrically connected to the wiring electrodes;
   a plurality of phosphor portions spaced apart at preset intervals and arranged along rows and columns, and respectively disposed between the semiconductor light emitting devices so as to convert light emitted by surrounding semiconductor light emitting devices into second light having a second wavelength and to emit the second light;
   a light transmitting material filled between the phosphor portions and emitting first light having a first wavelength emitted by the semiconductor light emitting devices; and
   a color filter covering the phosphor portions and the light transmitting material and emitting the first light with the first wavelength and the second light with the second wavelength.

2. The light source unit of claim 1, wherein the first light is a first red color having a first red wavelength and the second light is a second red color having a second red wavelength.

3. The light source unit of claim 1, further comprising:
   an optical gap layer between the semiconductor light emitting devices and the phosphor portions.

4. The light source unit of claim 1, further comprising:
   a lens having a convex shape toward the substrate disposed below a corresponding phosphor portion.

5. The light source unit of claim 1, wherein the phosphor portions correspond to dot-shaped phosphor portions.

6. The light source unit of claim 1, wherein the phosphor portions are respectively disposed in a region surrounded by the surrounding semiconductor light emitting devices.

7. The light source unit of claim 6, wherein corresponding centers of the phosphor portions are disposed in a middle of the region surrounded by the surrounding semiconductor light emitting devices.

8. The light source unit of claim 6, wherein the phosphor portions and the semiconductor light emitting devices are disposed so as not to overlap with each other along a thickness direction of the substrate.

9. The light source unit of claim 1, wherein the wiring electrode includes a common electrode surface on which the semiconductor light emitting devices overlap with each other, and
   wherein the common electrode surface forms a lower wiring.

10. The light source unit of claim 9, wherein an insulating material is filled between the semiconductor light emitting devices and forms an insulating layer, and
    wherein an upper wiring connected to the plurality of semiconductor light emitting devices is disposed on the insulating layer.

11. The light source unit of claim 10, wherein the lower wiring is electrically connected to either one of a p-type electrode and an n-type electrode of a corresponding semiconductor light emitting device, and
    wherein the upper wiring is connected to the other of the p-type electrode and the n-type electrode, and is formed in a line shape.

12. A car lamp comprising:
    a plurality of light emitting regions being combined with each other to implement a predetermined shape of the car lamp; and
    a light source unit disposed in corresponding light emitting regions,
    wherein a corresponding light source unit includes:
    a substrate including wiring electrodes;
    a plurality of semiconductor light emitting devices electrically connected to the wiring electrodes;
    a plurality of phosphor portions spaced apart at preset intervals and arranged along rows and columns, and respectively disposed between the semiconductor light emitting devices so as to convert light emitted by surrounding semiconductor light emitting devices into second light having a second wavelength and to emit the second light;
    a light transmitting material filled between the phosphor portions and emitting first light having a first wavelength emitted by the semiconductor light emitting devices; and
    a color filter covering the phosphor portions and the light transmitting material and emitting the first light with the first wavelength and the second light with the second wavelength.

13. The car lamp of claim 12, wherein the phosphor portions are respectively disposed in a region surrounded by the surrounding semiconductor light emitting devices.

14. The car lamp of claim 13, wherein corresponding centers of the phosphor portions are disposed in a middle of the region surrounded by the surrounding semiconductor light emitting devices.

15. The car lamp of claim 13, wherein the phosphor portions and the semiconductor light emitting devices are disposed so as not to overlap with each other along a thickness direction of the substrate.

* * * * *